(12) United States Patent
Hong et al.

(10) Patent No.: US 6,465,260 B1
(45) Date of Patent: Oct. 15, 2002

(54) SEMICONDUCTOR DEVICE HAVING A FERROELECTRIC CAPACITOR AND METHOD FOR THE MANUFACTURE THEREOF

(75) Inventors: Kwon Hong; Yong-Sik Yu, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 29 days.

(21) Appl. No.: 09/605,633

(22) Filed: Jun. 28, 2000

(30) Foreign Application Priority Data

Jun. 28, 1999 (KR) .................................... 99-24993

(51) Int. Cl.$^7$ ............................................. H01L 21/00
(52) U.S. Cl. ......................... 438/3; 438/240; 438/393
(58) Field of Search ......................... 438/3, 240, 393; 257/296, 393

(56) References Cited

U.S. PATENT DOCUMENTS

| | | | |
|---|---|---|---|
| 5,124,777 A | | 6/1992 | Lee |
| 5,198,269 A | * | 3/1993 | Swartz et al. ............... 427/226 |
| 5,250,817 A | | 10/1993 | Fink |
| 5,566,046 A | | 10/1996 | Kulwicki |
| 5,593,914 A | * | 1/1997 | Evans, Jr. et al. ............... 438/3 |
| 5,668,040 A | | 9/1997 | Byun |
| 5,800,683 A | | 9/1998 | Kammerdiner et al. |
| 5,864,153 A | * | 1/1999 | Nagel et al. ................. 257/296 |
| 5,969,935 A | | 10/1999 | Kammerdiner et al. |
| 6,072,207 A | * | 6/2000 | Yoshimori et al. .......... 257/395 |
| 6,086,665 A | * | 7/2000 | Kamisawa et al. .... 106/287.18 |

FOREIGN PATENT DOCUMENTS

| | | | |
|---|---|---|---|
| JP | 4-99365 | 3/1992 | ........... H01L/27/04 |
| JP | 9-142844 | 3/1992 | ........... C01G/29/00 |
| JP | 6-162857 | 6/1994 | ........... H01B/17/62 |
| JP | 6-163204 | 6/1994 | ........... H01C/7/02 |
| JP | 8-339716 | 12/1996 | ........... H01B/3/00 |
| JP | 9-77592 | 3/1997 | ........... C32B/25/00 |
| JP | 9-87848 | 3/1997 | ........... C23C/16/40 |
| JP | 10-4181 | 1/1998 | ........... H01L/27/10 |
| JP | 10-56140 | 2/1998 | ........... H01L/27/10 |
| JP | 10-326872 | 12/1998 | ........... H01L/27/10 |

\* cited by examiner

*Primary Examiner*—Long Pham
*Assistant Examiner*—William David Coleman
(74) *Attorney, Agent, or Firm*—Jacobson Holman, PLLC

(57) ABSTRACT

A semiconductor device for use in a memory cell includes an active matrix provided with a semiconductor substrate, a transistor formed on the semiconductor substrate, an isolation region for isolating the transistor and an insulating layer formed on top of the transistor and the isolation region; and a capacitor structure, formed on top of the insulating layer, composed of a bottom electrode, a capacitor thin film placed on top of the bottom electrode and a top electrode formed on top of the capacitor thin film, wherein the capacitor thin film is made of Nb doped lead zirconate titanate (PNZT). In the device, the PNZT is formed by using a sol-gel coating solution is represented by a formula $Pb_{(1-x/2)}Pb_x(Zr_{0.52}Ti_{0.48})_{(1-x)}O_3$, where x is equal to 0~0.05 assuming that Nb compensates charges generated by Pb vacancies. The semiconductor device can lower leakage current approximately 2 order by adding Nb dopants to the PZT. Further, the present invention is capable of forming the capacitance thin film on the bottom electrode at a low temperature by spin coating the PNZT coating solution in the form of sol-gel.

19 Claims, 5 Drawing Sheets

US 6,465,260 B1

SEMICONDUCTOR DEVICE HAVING A FERROELECTRIC CAPACITOR AND METHOD FOR THE MANUFACTURE THEREOF

FIELD OF THE INVENTION

The present invention relates to a semiconductor device; and, more particularly, to a semiconductor device having a ferroelectric capacitor for use in a memory cell and a method for the manufacture thereof.

DESCRIPTION OF THE PRIOR ART

As is well known, a dynamic random access memory (DRAM) having a memory cell comprised of a transistor and a capacitor has paved the way to a higher degree of integration mainly by down-sizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been proposed a ferroelectric random access memory (FeRAM) where a capacitor thin film with ferroelectric properties such as lead zirconate titanate (PZT) is used for a capacitor thin film.

However, the conventional PZT has several shortcomings for use in the FeRAM. One of the major difficulties of the PZT is that it has the concentration of mobile species such as transition metal ions and Pb vacancies due to the volatility of PbO. In this results, this phenomena causes leakage currents to rise in the PZT.

SUMMARY OF THE INVENTION

It is, therefore, an object of the present invention to provide a semiconductor device incorporating a ferroelectric capacitor therein, wherein the ferroelectric capacitor includes Nb doped lead zirconate titanate (PNZT).

It is another object of the present invention to provide a method for manufacturing a semiconductor device incorporating therein a ferroelectric capacitor with PNZT.

It is still another object of the present invention to provide a method for preparing a sol-gel coating solution of PNZT for use in a ferroelectric random access memory (FeRAM).

In accordance with one aspect of the present invention, there is provided a semiconductor device for use in a memory cell, comprising: an active matrix provided with a semiconductor substrate, a transistor formed on the semiconductor substrate, an isolation region for isolating the transistor and an insulating layer formed on top of the transistor and the isolation region; and a capacitor structure, formed on top of the insulating layer, composed of a bottom electrode, a capacitor thin film placed on top of the bottom electrode and a top electrode formed on top of the capacitor thin film, wherein the capacitor thin film is made of Nb doped lead zirconate titanate (PNZT).

In accordance with another aspect of the present invention, there is provided a method for manufacturing a semiconductor device for use in a memory cell, the method comprising the steps of: a) preparing an active matrix provided with a transistor and an insulating layer formed around the transistor; b) forming a capacitor structure on top of the insulating layer, wherein the capacitor structure includes a capacitor thin film made of PNZT; and c) forming a first metal layer and patterning a first metal layer into a predetermined configuration to electrically connect the transistor to the capacitor structure.

In accordance with still another aspect of the present invention, there is provided a method for forming a sol-gel coating solution to make a ferroelectric material, the method comprising the steps of: a) preparing precursors $P_1$, $P_2$, $P_3$ and $P_4$; b) dehydrating the $P_1$ in vacuum and dissolving the vacuum dehydrated $P_1$ in 2-methoxyethanol; c) mixing the dissolved $P_1$ and the $P_2$ under inert gas atmosphere, thereby obtaining a Pb—Nb solution; d) mixing the $P_3$ and the $P_4$ under inert gas atmosphere, thereby obtaining a Zr—Pb solution; e) refluxing the Pb—Nb solution and the Zr—Pb solution; f) adding $NH_4OH$ for base-catalyzed condition; and g) adding ethylene glycol as a kind of dry control chemical additive, thereby obtaining the sol-gel coating solution.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
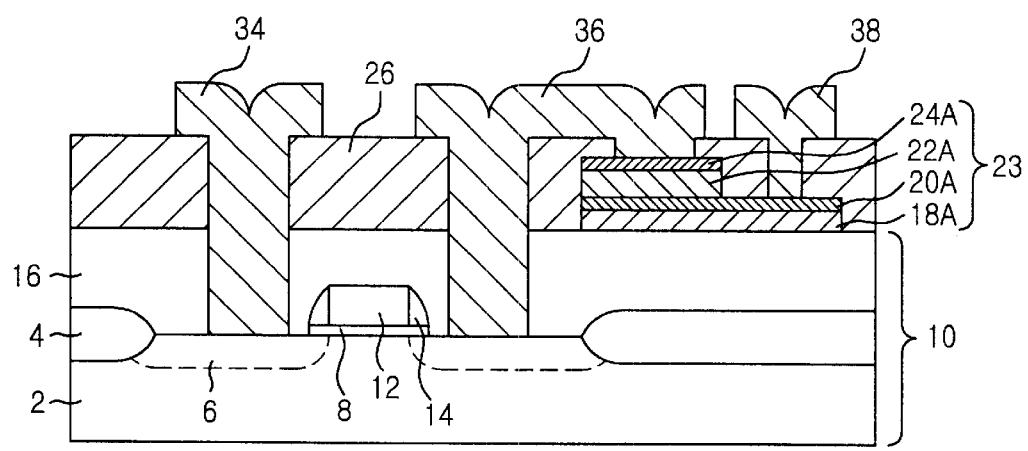
FIG. 1 shows a cross sectional view representing a semiconductor memory device having a ferroelectric capacitor structure in accordance with present invention.

There are provided in FIGS. 1, 2A to 2E and 3 a cross sectional view of a semiconductor device 100 for use in a memory cell and cross sectional views setting forth a method for the manufacture thereof and a flow chart setting forth a process for preparing a solution to form a ferroelectric thin film in accordance with preferred embodiments of the present invention. It should be noted that like parts appearing in FIGS. 1, 2A to 2E and 3 are represented by like reference numerals.

In FIG. 1, there is provided a cross sectional view of the inventive semiconductor device 100 comprising an active matrix 10 incorporating a metal oxide semiconductor (MOS) transistor therein, a capacitor structure 23 formed on top of the active matrix 10, a bit line 34, a metal interconnection 36 and a plate line 38. The active matrix 10 includes a semiconductor substrate 2, an isolation region 4 for isolating the MOS transistor, an insulating layer 16 formed on top of the MOS transistor and the isolation region 4. The MOS transistor further includes a gate oxide 8, a gate line 12 and a spacer 14. In the preferred embodiment, the semiconductor substrate 2 is made of silicon (Si), the insulating layer 16 is made of silicon dioxide ($SiO_2$) and the bottom electrode 20A is made of platinum (Pt). A buffer 18A, made of titanium (Ti), can be used for improving the adhesion between the insulating layer 16 and the bottom electrode 20A.

The capacitor structure 23 includes a capacitor thin film 22A placed on top of the bottom electrode 20A and a top electrode 24A formed on top of the capacitor thin film 22A, wherein the capacitor thin film 22A is made of Nb doped lead zirconate titanate (PNZT). In this embodiment, the PNZT is formed by using Pb and alkoxides.

In the semiconductor device 100, the bit line 34 is electrically connected to one of the diffusion regions 6 and the bottom electrode 20A is electrically connected to the other diffusion region 6 through the metal interconnection 36, wherein the bit line 34 and the metal interconnection 36 are electrically disconnected each other. The top electrode 24A is connected to a plate line 38 to apply a common constant potential thereto.

In FIGS. 2A to 2E, there are illustrated manufacturing steps involved in manufacturing a semiconductor memory device 100 in accordance with the present invention.

The process for manufacturing a semiconductor memory device 100 begins with the preparation of an active matrix 10 having a silicon substrate 2, a MOS transistor formed thereon as a selective transistor, an isolation region 4 and a first insulating layer 16 formed on the MOS transistor and the isolation region 4. The first insulating layer 16, e.g., made of silicon dioxide ($SiO_2$), is formed over the entire surface by a plasma chemical vapor deposition (CVD). The MOS transistor includes a pair of diffusion regions 6 serving as a source and a drain, a gate oxide 8, a spacer 14 and a gate line 12.

Figure 2A:
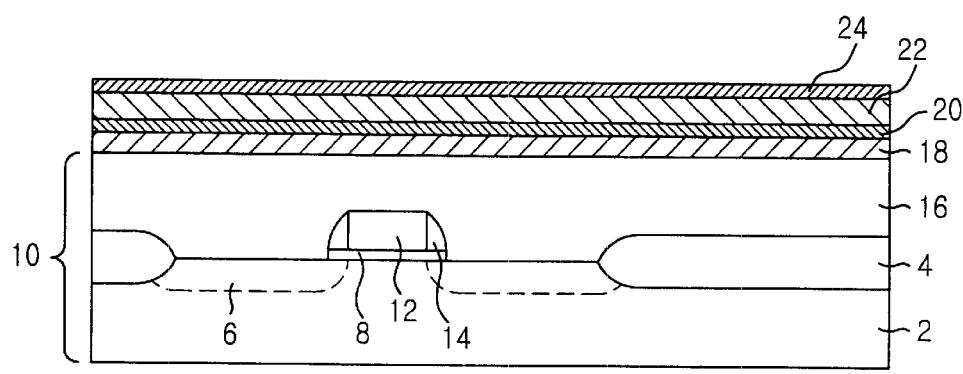
FIGS. 2A to 2E are schematic cross sectional views illustrating a method for the manufacture of the semiconductor memory device shown in FIG. 1.

In a subsequent step, there is formed on top of the active matrix 10 a buffer layer 18, a first metal layer 20 and a dielectric layer 22, subsequently, as shown in FIG. 2A. The buffer layer 18 is made of titanium (Ti) and the first metal layer 20 is made of platinum (Pt). The buffer layer 18 and the first metal layer 20 are deposited by using a method such as a sputtering. The dielectric layer 22 is made of a ferroelectric material of which manufacturing method is described in detail hereinafter with reference to FIG. 3.

The first step 50 of the process is the preparation of precursors, $P_1$, $P_2$, $P_3$, $P_4$, etc. In the preferred embodiment, $P_1$ is Pb-acetate trihydrate, $P_2$ is Nb-penta ethoxide, $P_3$ is Zr-normal propoxide and $P_4$ is Ti-iso propoxide. In step 52, the precursor $P_1$ is dehydrated with, e.g., 5 mole % excess Pb, in vacuum. And then, the hydrated precursor $P_1$ is dissolved in 2-methoxyethanol in step 58. The dissolved precursor $P_1$ and the precursor $P_2$ are then mixed in step 62, thereby obtaining a Pb—Nb solution.

On the other hand, the precursors $P_3$ and $P_4$ are diluted with a suitable solvent such as propanol (PrOH) in steps 54 and 56, respectively. Thereafter, the precursors P3 and P4 are chelated with ethylacetoacetate (EacAc) to decrease the susceptibility of the alkoxides to hydrolysis in step 60, thereby preparing a Zr—Pb solution in atmospheric condition in step 64. It is possible that, after the step 64, the chealation step 60 can be carried out.

In step 66, the Zr—Pb solution and the Pb—Nb solution are refluxed at a temperature ranging from approximately 60° C. to approximately 100° C. In the next step, the refluxed solution is changed into PNZT stock solution by adding a catalyst ($H_2O+NH_4OH+PrOH$), e.g., 0.05 mol $NH_4OH$, for base-crystalized condition in step 68. After the partial hydrolysis, ethylene glycol is added to the PNZT stock solution as a dry control chemical additive (DCCA) in step 70, thereby obtaining stable PNZT solution for the ferroelectric thin film coating. In the preferred embodiment, the ferroelectric thin film which is doped 0.3 M Nb is prepared according to the formula $Pb_{(1-x/2)}Pb_x(Zr_{0.52}Ti_{0.48})_{(1-x)}O_3$, where x is equal to 0~0.05 assuming that Nb compensates the charges generated by Pb vacancies. Finally, the stable PNZT coating solution is spin coated on top of the first metal layer 20, thereby obtaining the dielectric layer 22 which is made of PNZT. The PNZT has mole fraction of Zr(0.52) and Ti(0.48).

Referring back to FIG. 2A, a second metal layer 24 is formed on top of the dielectric layer 22. The second metal layer 24 is deposited with a method such as a sputtering.

Figure 2B:
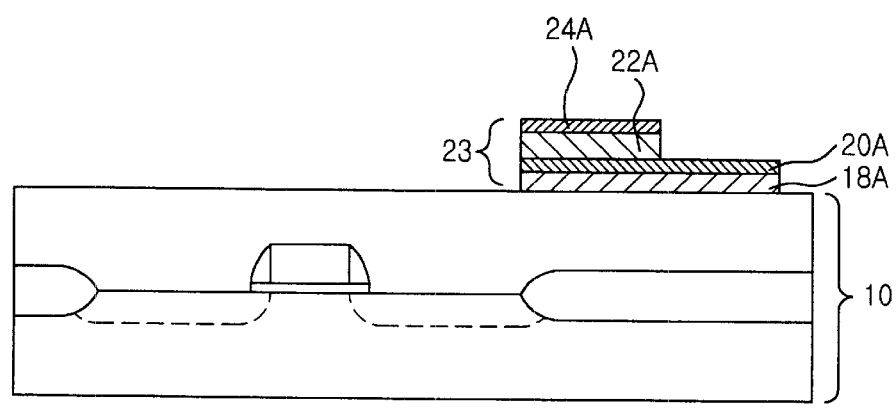

Thereafter, the second metal layer 24 and the dielectric layer 22 are patterned into a predetermined configuration. And then, the first metal layer 20 and the buffer layer 18 are patterned into a second predetermined configuration by using a photolithography method to thereby obtain a capacitor structure 23 having a buffer 18A, a bottom electrode 20A, a capacitor thin film 22A and a top electrode 24A, as shown in FIG. 2B. The buffer layer 18A is used for ensuring reliable adhesion between the bottom electrode 20A and the first insulating layer 16.

Figure 2C:
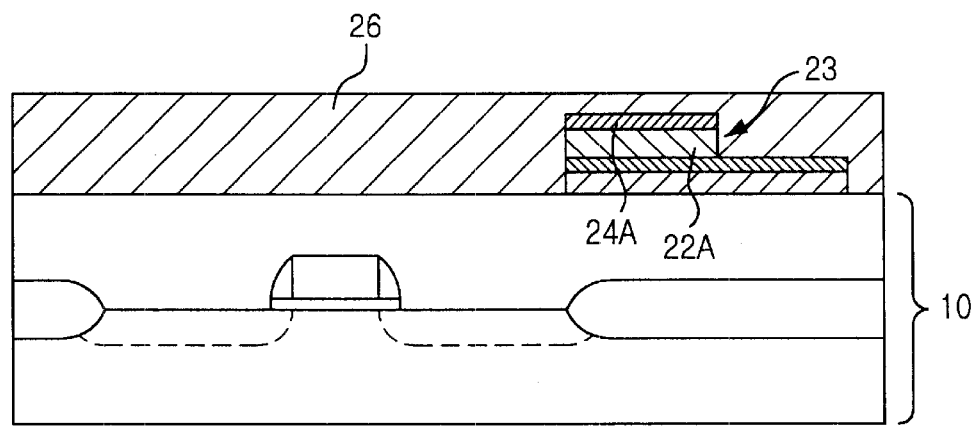

In a next step, a second insulating layer 26, e.g., made of silicon dioxide ($SiO_2$), is formed on top of the active matrix 10 and the capacitor structure 23 by using a plasma CVD, as shown in FIG. 2C.

Figure 2D:
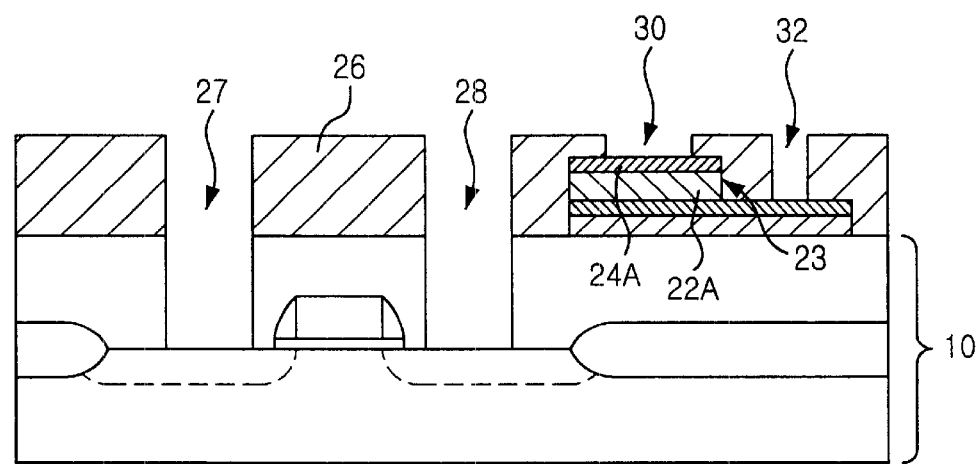

In an ensuing step, a first and a second openings 27, 28 are formed in the second and the first insulating layers 26, 16 in such a way that they are placed at positions over the diffusion regions 6, respectively. A third and a fourth openings 30, 32 are formed on top of the capacitor structure 23 through the second insulating layer 26 in such a way that they expose portions of the top and the bottom electrodes 24A, 20A, respectively, as shown in FIG. 2D.

Figure 2E:
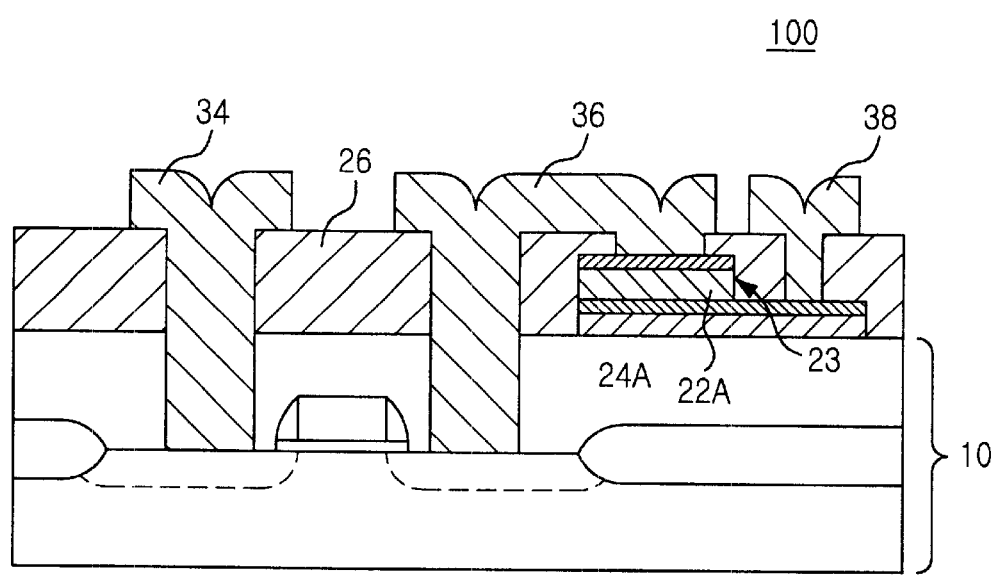
Figure 3:
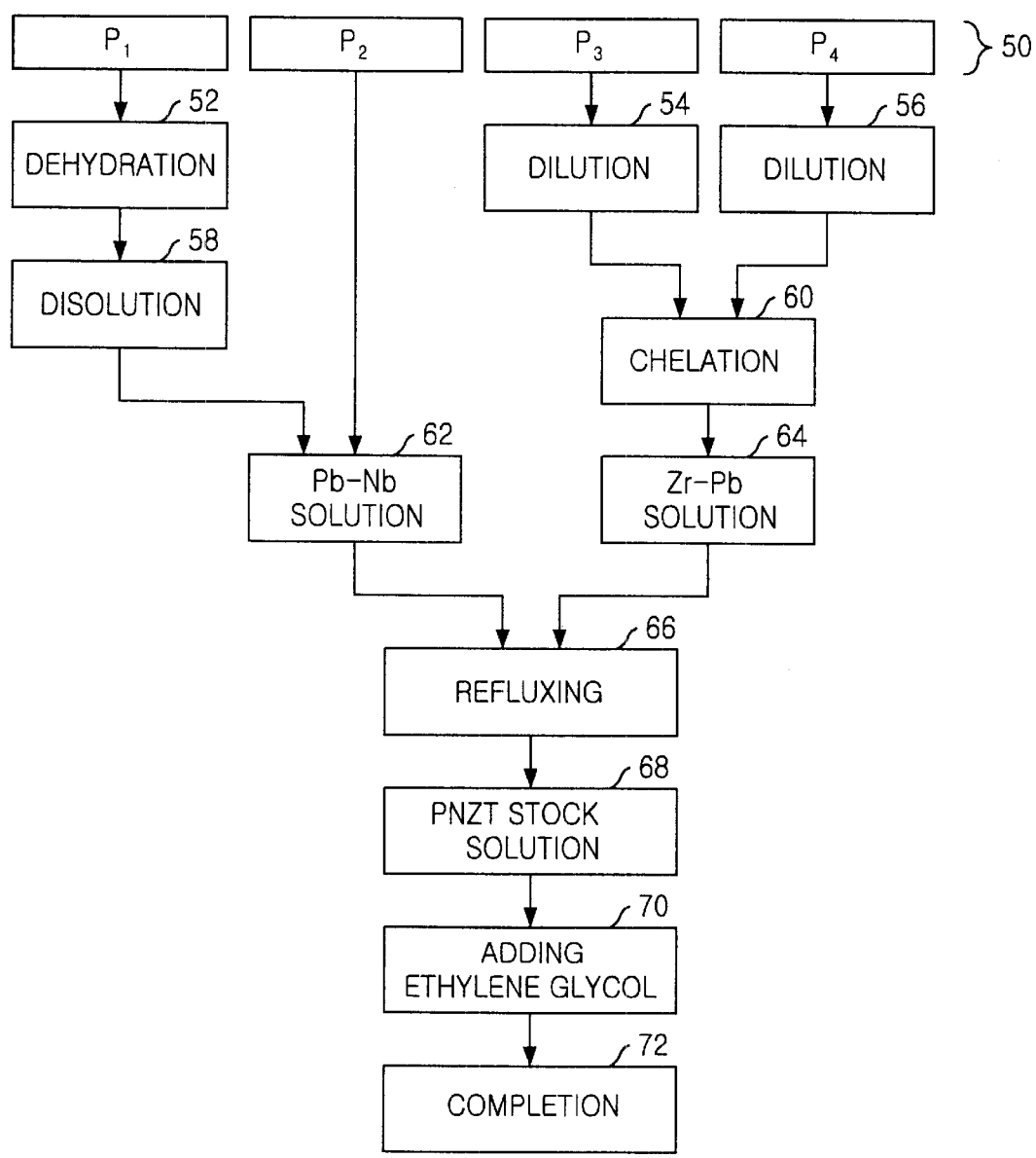
FIG. 3 is a flow chart showing a process for preparing a sol-gel coating solution to form a ferroelectric thin film in accordance with a preferred embodiment of the present invention.

Thereafter, an interconnection layer, e.g., made of a conducting material such as aluminum (Al), is formed over the entire surface including the interiors of the openings 27, 28, 30, 32, and is patterned to form a bit line 34, a metal interconnection 36 and a plate line 38, thereby obtaining the semiconductor memory device 100, as shown in FIG. 2E.

In comparison with the prior art, the present invention has lowered leakage current approximately 2 order by adding Nb dopants to the PZT.

Further, the present invention is capable of forming the capacitance thin film 22A on the bottom electrode 20A at a low temperature by spin coating the PNZT coating solution in the form of sol-gel.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, the method comprising steps of:
   a) preparing an active matrix provided with a transistor and an insulating layer formed around the transistor;
   b) forming a capacitor structure on top of the insulating layer, wherein the capacitor structure includes a capacitor thin film made of PNZT; and
   c) forming a first metal layer and patterning the first metal layer into a predetermined configuration to electrically connect the transistor to the capacitor structure, wherein the step b) includes:

preparing precursors $P_1$, $P_2$, $P_3$ and $P_4$;
   dehydrating the $P_1$ and dissolving the vacuum dehydrated $P_1$ in 2-methoxyethanol;

mixing the dissolved $P_1$ in vacuum, thereby obtaining a Pb—Nb solution;

mixing the $P_3$ and the $P_4$ under inert gas atmosphere, thereby obtaining a Zr—Pb solution;

refluxing the Pb—Nb solution and the Zr—Pb solution;

adding $NH_4OH$ for base-catalyzed condition;

adding ethylene glycol as a kind of dry control chemical additive, thereby obtaining a sol-gel coating solution; and spin coating the sol-gel coating solution on top of the first metal layer, thereby forming the capacitor thin film.

2. The method of claim 1, wherein the step b) includes:

b1) forming the first metal layer on top of the insulating layer;

b2) forming the capacitor thin film on top of the first metal layer;

b3) forming a second metal layer on top of the capacitor thin film layer; and b4) patterning the second metal layer and the capacitor thin film into a first preset configuration and patterning the first metal layer into a second preset configuration, thereby obtaining the capacitor structure.

3. The method of claim 2, after the step b4), the capacitor thin film is annealed in an oxygen gas at a temperature ranging from approximately 500° C. to approximately 700° C.

4. The method of claim 3, wherein the annealing process is carried out for approximately 30 minutes.

5. The method of claim 4, wherein the semiconductor substrate is made of Si.

6. The method of claim 5, wherein the insulating layer is made of an oxide material such as $SiO_2$.

7. The method of claim 6, wherein the bottom electrode is made of Pt/Ti.

8. The method of claim 1, wherein the PNZT is formed by using a sol-gel coating solution represented by a formula $Pb_{(1-x/2)}Nb_x(Zr_{0.52}Ti_{0.48})_{(1-x)}O_3$, where x is equal to 0~0.05 and Nb compensates charges generated by Pb vacancies.

9. The method of claim 2, before the step b3), further comprising the step for annealing the capacitor thin film at a low temperature.

10. A method for forming a sol-gel coating solution to make a ferroelectric material, the method comprising steps of:

a) preparing precursors $P_1$, $P_2$, $P_3$ and $P_4$;

b) dehydrating the $P_1$ in vacuum and dissolving the vacuum dehydrated $P_1$ in 2-methoxyethanol;

c) mixing the dissolved $P_1$ and the $P_2$, thereby obtaining a Pb—Nb solution;

d) mixing the $P_3$ and the $P_4$ under inert gas atmosphere, thereby obtaining a Zr—Pb solution;

e) refluxing the Pb—Nb solution and the Zr—Pb solution;

f) adding $NH_4OH$ for base-catalyzed condition; and g) adding ethylene glycol as a kind of dry control chemical additive, thereby obtaining the sol-gel coating solution.

11. The method of claim 10, wherein the $P_1$ is Pb-acetate trihydrate, $P_2$ is Nb-penta ethoxide, $P_3$ is Zr-normal propoxide and $P_4$ is Ti-iso propoxide.

12. The method of claim 11, wherein the step b) is carried out with approximately 5 mole % excess Pb.

13. The method of claim 12, wherein the Zr—Pb solution is prepared in atmospheric condition.

14. The method of claim 13, wherein the step e) carried out for an hour at approximately 106° C.

15. The method of claim 14, before the step d), further comprising the step for diluting the $P_3$ and the $P_4$.

16. The method of claim 15, after the diluting step, further comprising the step for chealating the diluted $P_3$ and the $P_4$.

17. The method of claim 14, after the step d), further comprising the step for chealating the diluted $P_3$ and the $P_4$ are chealated.

18. The method of claim 10, wherein the step c) is carried out under inert gas atmosphere.

19. The method of claim 10, wherein the sol-gel coating solution is represented by a formula $Pb_{(1-x/2)}Nb_x(Zr_{0.52}Ti_{0.48})_{(1-x)}O_3$, where x is equal to 0~0.05 and Nb compensates charges generated by Pb vacancies.

* * * * *